United States Patent [19]
Chen

[11] Patent Number: 5,409,155
[45] Date of Patent: Apr. 25, 1995

[54] VIBRATIONAL SELF ALIGNING PARTS IN A SOLDER REFLOW PROCESS

[75] Inventor: Wun-Shyong Chen, Fremont, Calif.

[73] Assignee: Solectron Croporation, Milipitas, Calif.

[21] Appl. No.: 52,479

[22] Filed: Apr. 23, 1993

[51] Int. Cl.⁶ .................. B23K 1/06; B23K 1/008; H05K 3/34
[52] U.S. Cl. .................. 228/6.2; 228/232; 228/234.1; 228/262
[58] Field of Search .......... 228/180.1, 180.21, 180.22, 228/111.5, 6.2, 232, 234.1 A, 262

[56] References Cited

U.S. PATENT DOCUMENTS

| | | | |
|---|---|---|---|
| Re. 33,197 | 4/1990 | Deambrosio | 228/262 X |
| 3,005,257 | 10/1961 | Fox | 228/262 X |
| 3,716,907 | 2/1973 | Anderson | 228/262 X |
| 3,791,028 | 2/1974 | Missel | 228/111 |
| 3,882,596 | 5/1975 | Kendziora et al. | 228/200 |
| 4,529,115 | 7/1985 | Renshaw et al. | 228/1.1 |
| 4,619,715 | 10/1986 | Hwang | 228/248 UX |
| 4,684,056 | 8/1987 | Deambrosio | 228/180.1 |
| 4,696,226 | 9/1987 | Witmer | 98/36 |
| 4,730,764 | 3/1988 | Hawkins et al. | 228/1.1 |
| 4,831,724 | 5/1989 | Elliott | 228/180.1 |
| 5,028,399 | 7/1991 | Suppelsa et al. | 422/211 |
| 5,076,487 | 12/1991 | Bandyopadhyay | 228/219 |
| 5,085,364 | 2/1992 | Ishikawa | 228/180.21 X |
| 5,121,874 | 6/1992 | Deambrosio | 228/219 |
| 5,145,531 | 9/1992 | Turner et al. | 148/23 |
| 5,259,546 | 11/1993 | Volk | 228/232 X |

OTHER PUBLICATIONS

Graham, "Surface Mount Technology" Sep. 1990 pp. 51–54.
Graham, "Achieving Perfect SMT Component Location After Reflow" *Surface Mount Technology* (1990) 51–54.

*Primary Examiner*—Kenneth J. Ramsey
*Attorney, Agent, or Firm*—Wilson, Sonsini, Goodrich & Rosati

[57] ABSTRACT

A method and apparatus for soldering areas of two parts together such as solder leads of an electronic component to the solder pads on a printed circuit board which includes the step of raising the temperature of the abutting areas to a value greater than the melting temperature of the solder and while at the elevated temperature, vibrating the parts to align (center) the areas with respect to one another. Accordingly a reflow oven designed to practice this invention includes a conveyor system with three continuous belts leading in series from the entrance to the exit of the oven. The first belt carries the parts through a temperature zone where melting of the binder occurs; the second belt carries the parts through a hotter zone where melting of the solder and vibration to effect centering occurs; the third belt carries the part through the cooling zone. Separation of the belt into three isolated sections prevents disturbance of the parts when they are located in areas where the solder is not molten.

8 Claims, 3 Drawing Sheets

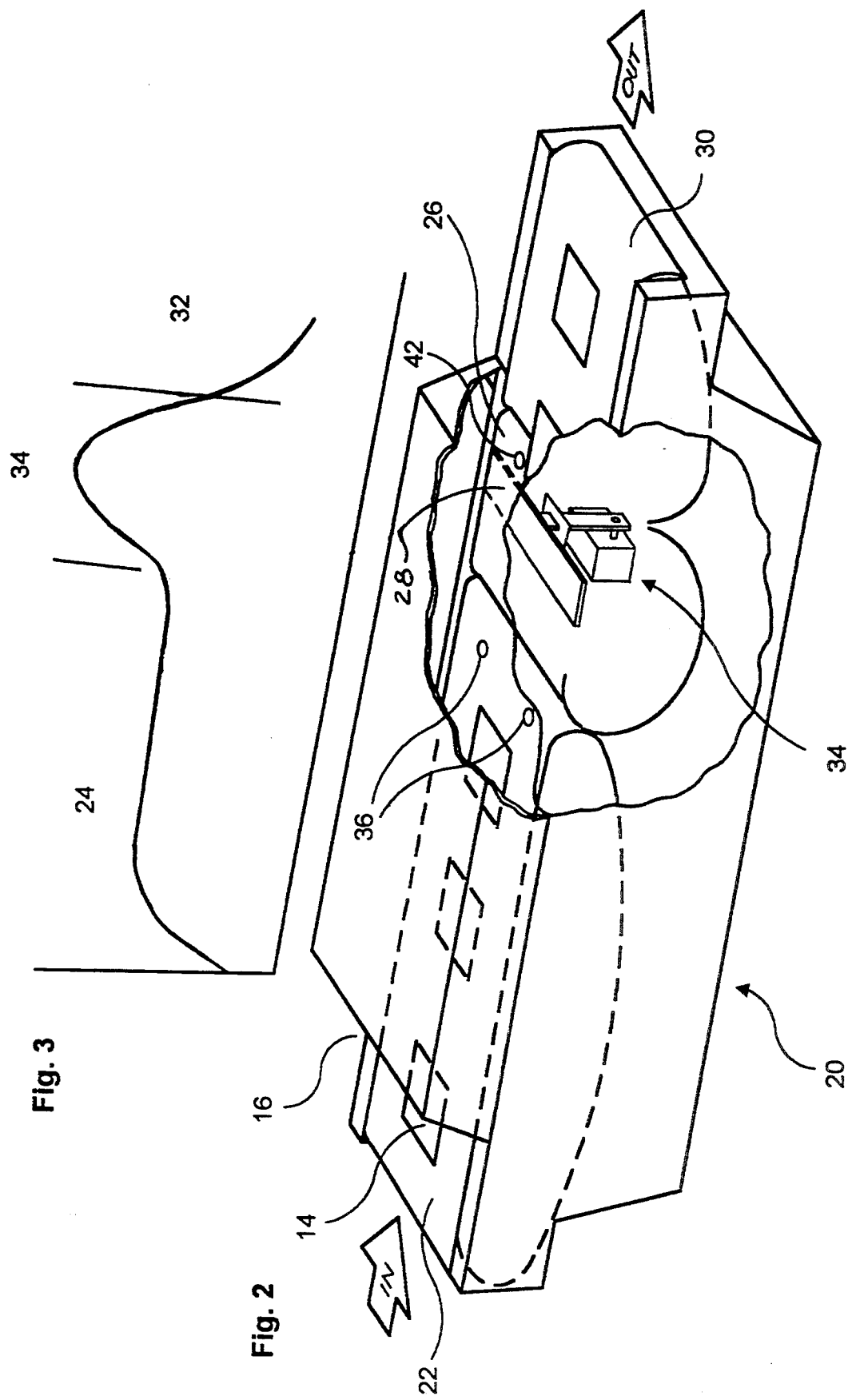

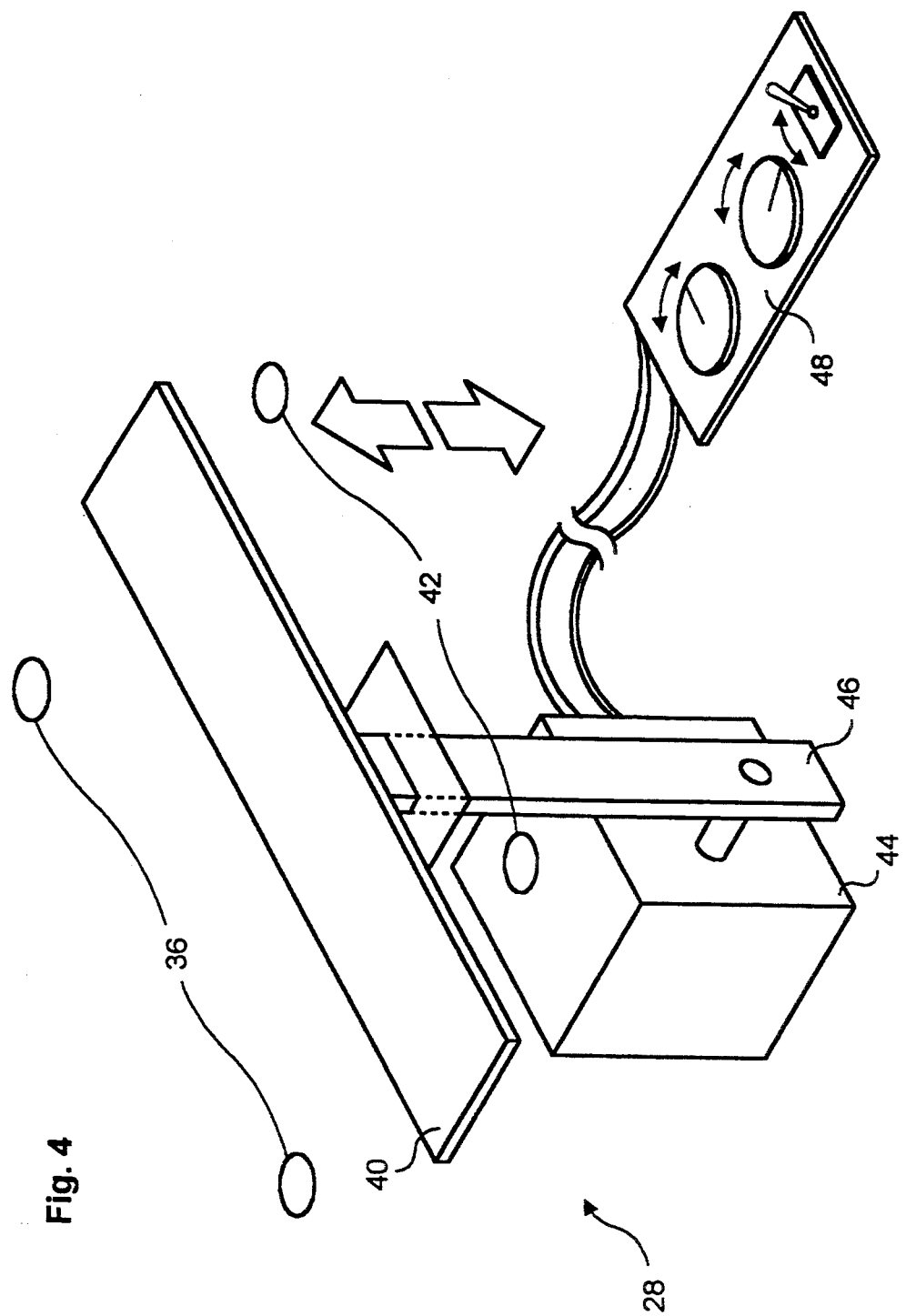

VIBRATIONAL SELF ALIGNING PARTS IN A SOLDER REFLOW PROCESS

BACKGROUND

1. Field of the Invention

This invention relates to solder reflow techniques in manufacturing processes of printed circuit boards and particularly to a technique of maintaining alignment of parts to be soldered to the solder pads of a printed circuit board by the reflow process.

2. Background and Information Disclosure

Surface mount manufacturing processes of printed circuit boards have evolved to a very complicated technology involving a number of disciplines including mechanics, plastics chemistry, metallurgy, electrochemistry and electronics. The constant drive toward reduced cost has intensified a requirement for more dependable and precise procedures.

The major requirement in fabricating printed circuit parts is to form connections between leads from the various components and terminations on a substrate. This requirement has led to numerous disclosures that depend on the physical characteristics of the parts.

The forerunner of techniques in this field is the well known solder joint. Solder technology has incorporated chemical techniques for precleaning surfaces, metallurgical considerations that have led to optimum solder alloy compositions, heating devices including soldering irons and/or ovens providing accurate control of temperature, etc.

As the size of the components and leads has decreased and the number of leads to be terminated has increased, the approaches to meeting the requirements have become more complex.

Recognition that joining two abutting metal surfaces involves raising the surface energy of the interface of the two surfaces to a point where adhesion of the two metals occurs has led to consideration of the methods in which raising the interfacial surface energy may be achieved.

One method involves putting the two surfaces in contact and raising the temperature of the interface to the melting temperature of one of the metals by simple thermal conduction such as in an oven or with a soldering iron.

Another method of raising the energy of the interface is by sending an electrical current through the interface which is the familiar welding technique.

A less familiar technique is by the use of mechanical vibration known as ultrasonic welding. In the practice of ultrasonic welding, frictional energy is generated by virtue of the two surfaces rubbing one another and the generation of the energy leads to the welding of the two surfaces together. The frequencies used in order to generate sufficiently high interfacial energy is of the order of many kilocycles per second.

For example, U.S. Pat. No. 4,730,764 to Hawkins et al discloses an apparatus for ultrasonically welding a wire to a wire terminal involving an anvil which holds the wire against the terminal while injecting ultrasonic energy into the interface.

U.S. Pat. No. 4,529,115 to Renshaw et al is for a thermally assisted ultrasonic welding apparatus and process in which the interface between parts is preheated then subjected to ultrasonic welding (in the absence of further applied heat). The parts are first preheated to a temperature of 150° F. and then ultrasonically welded. Ultrasonic welding normally generates additional heat so variations in the size of the welds occur as a function of the thermal history of the welding anvil. Therefore, the patent teaches the introduction of a preheating step together with variability of the welding energy in order to obtain a temperature of the surface being welded that is constant from one weld to the next thereby providing uniform welds from one weld to the next.

U.S. Pat. No. 3,791,028 to Missel is for a bonding technique in which a soft metal, preferably gold or lead, is plated onto the surfaces of parts to be bonded. The parts are then clamped together and ultrasonic energy is injected with an anvil. Bonding takes place strictly by virtue of the ultrasonic frictional energy developed. No movement of the parts occurs during the bonding step.

Another important process in surface mount technology is reflow soldering, illustrated in FIG. 1. According to this technique, the exposed copper printed circuits on the surface of a printed circuit board are clad with solder such as by electroplating the tin lead alloy (solder) onto one or both surfaces or by soldering. Another method of applying the solder to the board prior to reflow is to apply the solder as a paste, i.e., a mixture of solder particles in a resinous viscous medium. Then components (integrated circuits, transistors, etc.) are positioned on the board with component leads in contact with the solder pads. Next, the board with components in situ are placed on a conveyor belt and passed through an oven of the type shown in FIG. 1. The board with solder is heated to above the melting temperature of the solder then cooled so that the leads are soldered to the respective solder pads.

A number of precautions must be exercised in implementation of this technique. One problem is oxidation of the surface of the solder and the surface of the part that diminishes wettability of the surface by the solder. Therefore, the practice has been followed to perform the reflow step in a reducing atmosphere. U.S. Pat. No. 5,028,399 to Suppelsa et al discloses use of a catalyst (Ni, Ag, Cu plug) in a manifold delivering reducing gas (formic acid) to effectuate a reduction of the dissociation temperature of the gas so that the gas will be more active as a reducing agent at the reflow temperature.

Another limitation of surface mounting of components involving the reflow step is the accuracy of automatically placing the parts on the board and having them stay in place while the board is transferred to the reflow oven and passed through the reflow zone. Displacement of leads of the components from their respective solder pads is a major limitation of the process, not only in terms of yield, but also in terms of the size of the pad which is feasible to incorporate in design of the board. Production costs are also increased by the necessity of having an operator visually inspect parts as they emerge from the line and then undertake the cost of rework. For optimum reliance of a terminal soldered to a solder pad, the terminal should be located with its center aligned with the center of the pad. In the context of this specification, the terms "aligned" and "centered" are to be understood as meaning that the termination (lead) makes contact with the solder pad in the center of the pad as distal as possible from the edges of the pad.

It will also be understood that the term "solder" applies to alloys used to join metal surfaces by wetting the surfaces with molten solder then allowing the solder to solidify. Solder alloys include tin, lead, silver, gold, indium and other metals known in the art.

SUMMARY OF THE INVENTION

This invention is directed toward a solder reflow process in which, at some select time during the process after the solder has melted, the board is subjected to vibration of a nature which causes the leads in contact with respective pads of molten solder to become re-aligned in the center of the pads.

In one embodiment, where solder is first applied to the board as a paste, the reflow process is performed in three steps. In the first step, the board with components is brought up to an intermediate temperature where melting of the resinous component of the solder paste takes place. In the next step, the board with components in place is heated to above the melting temperature of the solder and, simultaneously, the board is vibrated causing the leads of the components to be centered (aligned) in their respective solder pads. Finally, the board is permitted to cool down to room temperature.

The oven of this embodiment has three endless conveyor belts arranged end to end corresponding to the three steps in the process. The first belt carries the board through a section of the oven where melting of the solder binder occurs. The second belt carries the board through the solder melt zone where the board is vibrated to center the leads on the pad. The third belt carries the board through the cooling zone.

It is an object of this invention to improve yield in the reflow solder step of a process for manufacturing printed circuit boards in terms of improved registration of the leads of the component with their respective solder pads.

It is another object to reduce the size of the pad that is feasible to incorporate into the design of the printed circuit board.

It is another object to reduce the burden of inspection for misalignment of components after the components have been soldered to the board.

It is another object to reduce the amount of rework required in the manufacturing process due to misalignment after the reflow step.

BRIEF DESCRIPTION OF THE DRAWINGS

FIG. 2 shows a reflow oven of the present invention featuring three conveyor sections and a vibrator.

FIG. 3 shows the temperature of the three step process with respect to the position of the board in the oven.

FIG. 4 shows details of the vibrator mechanism.

DETAILED DESCRIPTION OF A PREFERRED EMBODIMENT

Figure 1:
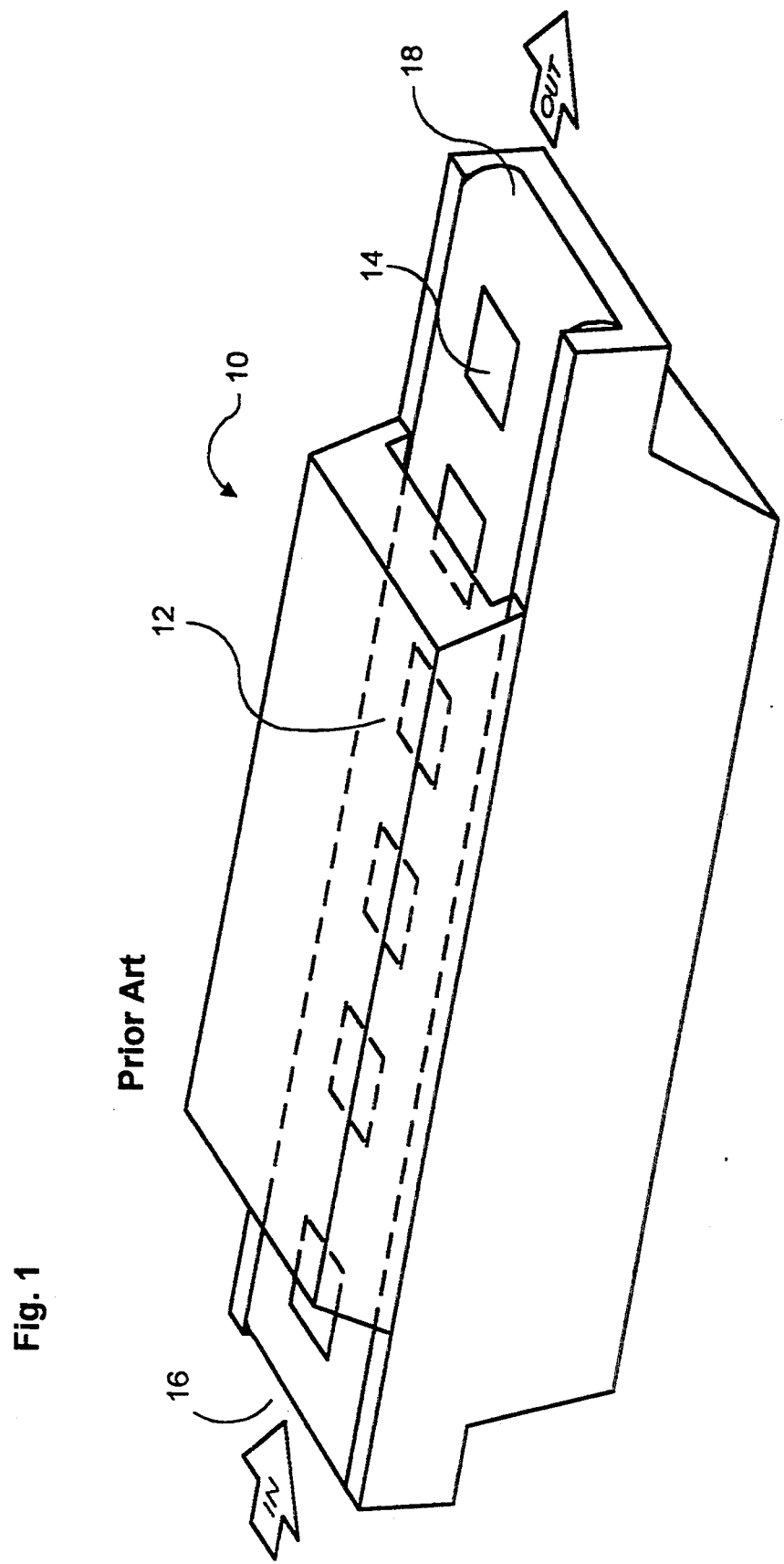
FIG. 1 shows a reflow oven of the prior art.

The following paragraphs contain various modifications and variations of the invention including what I presently believe to be the best means for carrying out the invention.

Turning now to a discussion of the drawings, FIG. 1 shows a reflow oven 10 of the prior art having a single conveyor belt according to the present state of the art. Printed circuit boards 14 with components loaded thereon (but not shown in the figures) are placed on the belt 12 at the entrance end 16 and removed from the exit end 18 of the oven 10.

FIG. 2 shows one embodiment of the invention which is a reflow oven 20 having three conveyor belts. By using three belts isolated from one another, vibration is confined to just the melt zone thereby avoiding disturbing the components when they are not in condition to be centered by molten solder. The first conveyor belt 22 carries the boards 14 from the entrance 16 through a heat zone maintained at a temperature where the solder paste reaches a liquid state in the paste melting zone 24 (FIG. 3). The second conveyor belt 26 carries the boards 14 through a zone 34 (FIG. 3) which is maintained at a temperature greater than the melting temperature of the solder alloy. While passing through this second stage, the boards 14 are vibrated by the vibrator 28 which has its vibrating platform slidably positioned against the under side of the second belt 26. The vibrating action aligns the component terminals with the solder pads on the respective printed circuit pads in accordance with the invention. The third conveyor belt 30 carries the boards 14 through cooling zone 32 (FIG. 3) which is a cooling down phase. FIG. 3 shows the temperature of the three step process at each stage where time corresponds to position in the oven.

FIG. 4 shows details of the vibrator mechanism 28 including a vibration generator 44 and a vertical arm 46 that transmits vibrations from the generator 44 to a vibrating platform 40 which is positioned against the under side of the second conveyor belt 26 (FIG. 2). As shown in FIGS. 2-3, when the boards 14 reach the end of the first conveyor stage 24, a pair of optical sensors 36 placed at the end of the first conveyor belt 22 detects arrival of a printed circuit board 14. At this stage in the heating cycle, the solder paste has turned liquid. When the sensors 36 detect arrival of a board 14, the vibrating mechanism 28 is activated which vibrates the board 14. The temperature in this region exceeds the melting temperature of the solder. The result of the vibration is that the components are pulled with the leads into alignment in the center of the solder pads as the board 14 is advanced by the second conveyor belt 26. A second pair of optical sensors 42 placed at the end of the solder melt zone 34 deactivates the vibrating mechanism 28 when the arrival of the board at the end of the vibration zone is detected. The board 14 then passes to a third conveyor belt 30 where it is carried through the cooling zone 32. A device 48 is shown which is connected to the vibration generator 44 for controlling amplitude and frequency of vibration according to well known techniques.

FIG. 4 is a perspective view of the vibrating mechanism showing a vertical support bar 46 mounted at its lower end to a vibration generator 44. A horizontal table 40 is mounted on the upper end of the vertical support bar and is positioned against the underside of the second conveyor belt 26 as shown in FIG. 2. Optical sensors 36 are shown positioned to detect arrival of a board at the vibration stage and turn on the vibration generator 44 (board shown in FIG. 2.). The second pair of sensors 42 are shown positioned to detect the arrival of the board at the cooling stage and deactivate the vibration generator 44.

An important feature of the oven is the three conveyor belts that are separate from one another and thereby isolate the vibration action from the premelt zone and the cooling zone. This feature ensures that the board vibrates only when the component leads are in contact with the molten solder puddle. It has been found that, when the board is vibrated when the solder is not melted, the vibration may displace the leads from their respective pads.

I have found that the alignment procedure is effective over a wide range of vibration conditions. However, vibration in the direction perpendicular to the board is preferred in which the amplitude is in a range from 0.001 to 0.006 inches. The alignment procedure is also effective over a broad range of frequencies, however, a frequency in the range from fifteen to forty vibrations per second is preferred.

Although I do not wish to be bound by theory, I believe that the component leads are brought into alignment by surface tension forces of the molten solder surface interacting with the surface of the metal leads. Surface energy giving rise to surface tension is well known to be a function of the radius of curvature of the surface of the body. Therefore, the molten solder tends to achieve a spherical shape with the result that the radius of curvature of the surface of a solder pad is greater at the edges of the pad than at the center. A wire termination penetrating the surface of the molten solder at the edge of the pad would be expected to attract molten solder to increase the interfacial area between the lead and the solder. Simultaneously, the pad (drop) of solder tends to retain its spherically shaped surface in order to reduce surface energy of the molten solder. The result of these two interactions is the centering of the lead in the solder pad.

The present invention is distinguished from processes of the prior art such as thermally assisted ultrasonic welding in that the object of the latter process is to control temperature of a junction between solid parts in order to provide uniformity of size and strength of a multiplicity of welds. A major feature of the present invention is to raise the temperature of a junction between parts to above the melting temperature of one of the parts such that the solid part assumes a desired position presumably by virtue of surface tension of the melted part.

While the preferred embodiment described above is particularly applicable to mass production of printed circuit boards, other embodiments are suggested by reading the description and studying the drawings which are within the scope of the invention.

For example, an apparatus of the invention may include an oven with no conveyor belts in which the board or groups of boards are simply placed on a vibrator in the oven with the oven at close to room temperature. The temperature of the oven is then raised to first liquify the solder paste after which the vibrator is turned on and the temperature is increased to the melting point. Finally, the oven is cooled down to permit removal of the boards.

Either one or both areas of parts to be soldered together may be clad with solder.

It will also be understood that the area or areas to be joined could be clad with a solder medium that would be in a form of the pure solder alloy such as would be the case if the area is electroplated with the solder alloy or contacted with a reservoir of molten solder or the solder medium could be in the form of a paste composed of solder particles dispersed in a resinous binder.

In another embodiment, the heating source is an infrared radiator for applications where it is required not to overheat the substrate yet melt the solder.

I therefore wish to define the scope of my invention by the appended claims and in view of the specification if need be.

I claim:

1. An apparatus for soldering a first area of a first part to a second area of a second part, wherein said first area is positioned against said second area and wherein solder or solder paste is applied to at least one of said areas, comprising:

an oven for heating said first and second parts to a temperature greater than a melting temperature; and means, disposed in said oven, for vibrating said first and second parts at a frequency and amplitude of vibration such that said first area is centered to said second area, wherein said oven comprises a conveying means adapted for conveying said first and second parts with said first area positioned against said second area and permitting said first and second parts to be vibrated in contact with one another thereby centering said first and second areas, wherein said conveying means is a belt member; and wherein said oven has an entrance and an exit and said belt member is a first continuous belt, a second continuous belt and a third continuous belt, adapted such that said first and second parts move through said entrance on said first continuous belt and are carried by said first continuous belt through a first oven zone to a second oven zone then carried by said second continuous belt through said second oven zone to a third oven zone then carried by said third continuous belt through said third oven zone to said exit and wherein said means for vibrating in operative combination with said second continuous belt is adapted to vibrate said first and second parts while said first and second parts are being carried through said second oven zone.

2. An apparatus as in claim 1 wherein said solder applied to at least one of said areas is a solder paste composed of solder alloy particles and a resinous binder, said temperature in said first zone is elevated to a first value selected to melt said resinous binder and a temperature in said second zone is elevated to a second value selected to melt said solder alloy.

3. An apparatus as in claim 2 where said first temperature value is selected from a range of values from 140° to 160° C. and said second temperature value is selected from a range of values from 180° to 250° C.

4. An apparatus as in claim 3 wherein a dwell time of said board in said first oven zone is a period selected from a range of periods from 180 seconds to 240 seconds, and a dwell time in said second oven zone is a period selected from a range of periods from 30 seconds to 60 seconds.

5. An apparatus for soldering a first area of a first part to a second area of a second part, wherein said first area is positioned against said second area, and at least one of said areas is clad with solder or coated with a solder paste having a melting temperature, comprising:

an oven for heating said first and second parts to a temperature greater than said melting temperature; and means, positioned in said oven, for vibrating said first and second parts at a frequency and amplitude of vibration such that said first area is centered to said second area, wherein said oven has an entrance, an exit and a belt member, adapted for conveying said first and second parts with said first area positioned against said second area to said vibrator means and permitting said first and second parts to be vibrated in contact with one another, thereby centering said first and second areas, wherein said belt member includes a first continuous belt, a second continuous belt, and a third continuous belt adapted such that said first and second parts placed with said first area abutting said second area are carried through said entrance on said first continuous belt and are carried by said first continuous belt through a first oven zone to a second oven zone, then are carried by said second continuous belt through said second oven zone to a third oven zone, then are carried by said third continuous belt through said third oven zone to said exit and wherein said means for vibrating in operative combination with said second continuous belt is adapted to vibrate said first and second parts while said first and second parts are being carried through said second oven zone.

6. An apparatus as in claim 5 wherein said solder applied to at least one of said areas is a solder paste composed of solder alloy particles and a resinous binder, said temperature in said first zone is elevated to a first value selected to melt said resinous binder and a temperature in said second zone is elevated to a second value selected to melt said solder alloy.

7. An apparatus as in claim 6 wherein said first temperature value is selected from a range of values from 140° to 160° C. and said second temperature value is selected from a range of values from 180° to 250° C.

8. An apparatus as in claim 7 wherein a dwell time of said board in said first oven zone is a period selected from a range of periods from 180 seconds to 240 seconds, and a dwell time in said second oven zone is a period selected from a range of periods from 30 seconds to 60 seconds.

* * * * *